United States Patent [19]
Inoue

[11] Patent Number: 5,993,946
[45] Date of Patent: Nov. 30, 1999

[54] WIRING BOARD FOR MOUNTING ELECTRONIC DEVICES WITH HIGH-DENSITY TERMINALS AND METHOD FOR PRODUCING WIRING BOARD

[75] Inventor: Tatsuo Inoue, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/648,915

[22] Filed: May 16, 1996

[30]  Foreign Application Priority Data

May 18, 1995 [JP] Japan ................................ 7-119573

[51] Int. Cl.$^6$ ............................................. B32B 3/00
[52] U.S. Cl. ..................... 428/210; 174/261; 174/262; 361/737; 361/741; 361/746; 361/767; 361/808; 361/810; 428/901
[58] Field of Search ................................. 428/210, 901; 361/728, 736, 737, 767, 772, 808, 741, 746, 810; 174/261, 262

[56]  References Cited

U.S. PATENT DOCUMENTS

| | | | |
|---|---|---|---|
| 3,447,038 | 5/1969 | Liben | 174/261 |
| 4,641,425 | 2/1987 | Dubuisson et al. | 174/261 |
| 4,685,033 | 8/1987 | Inoue | 361/414 |
| 4,731,699 | 3/1988 | Nitta et al. | 361/386 |
| 4,816,323 | 3/1989 | Inoue | 428/200 |
| 5,034,802 | 7/1991 | Liebes, Jr. et al. | 357/74 |
| 5,241,134 | 8/1993 | Yoo | 361/772 |
| 5,406,459 | 4/1995 | Tsukamoto et al. | 361/767 |
| 5,484,963 | 1/1996 | Washino | 174/261 |
| 5,488,542 | 1/1996 | Ito | 361/793 |
| 5,861,664 | 1/1999 | Inoue | 257/697 |

FOREIGN PATENT DOCUMENTS

| | | |
|---|---|---|
| 0 602 257 A1 | 12/1992 | European Pat. Off. . |
| 24 43 850 | 4/1975 | Germany . |
| 36 20944 A1 | 1/1988 | Germany . |
| 2 211 667 | 7/1989 | United Kingdom . |

*Primary Examiner*—Deborah Jones
*Assistant Examiner*—Cathy F. Lam
*Attorney, Agent, or Firm*—McGinn & Gibb, P.C.

[57]  ABSTRACT

A lattice of a wiring or terminal pattern is varied at areas on a wiring board. The spacing of the wiring lattice is reduced only in a predetermined area for a device having many terminals. An alignment pattern is provided in the predetermined area. The spacing of the wiring lattice in the central portion of the wiring board may be the finest and may get gradually coarser toward the peripheral portion of the wiring lattice.

17 Claims, 3 Drawing Sheets

WIRING BOARD FOR MOUNTING ELECTRONIC DEVICES WITH HIGH-DENSITY TERMINALS AND METHOD FOR PRODUCING WIRING BOARD

BACKGROUND OF THE INVENTION

The present invention relates to a wiring board used in electronic equipment and a method of producing the wiring board, and more particularly to a wiring board for mounting electronic devices with high-density terminals and a method of production thereof.

In a conventional thick-film wiring board fabrication method, inter-layer insulation materials and wiring materials are alternately stacked, and are baked at the same time. For example, a green sheet is used as the inter-layer insulation material and a conductive paste is used as the wiring material.

In a conventional thick-film wiring board, wiring patterns and electrodes cover the entire area of the wiring board according to the same basic wiring lattices.

In the conventional thick-film wiring board, the interlayer insulation material contracts during baking. With such contraction, the wiring material also contracts. Under the current technology, controlling this contraction during fabrication is limited (e.g., an error of approximately 0.2% of the target size).

Because of this error during fabrication, the terminal density of devices to be mounted on the wiring board or the terminal density connecting between the wiring board and an external circuit (i.e., a reduction in the terminal pattern size) is limited. For example, in a square-shaped thick-film wiring board having a side length of 100 mm, if it is assumed that the wiring pattern contains a fabrication error of 0.2% with respect to an expected size, the spacing between a pad provided on one end of the board and a pad provided on a second end will be dislocated (e.g., deviated) from a designed value by up to 0.2 mm. Therefore, when pads for external circuits are arranged on outer regions of a wiring board, the spacing between the pads must be great enough to absorb the fabrication error (e.g., on the order of approximately 0.4 mm for a fabrication error of 0.2 mm).

Similarly, when pads for a square device have a side length of 10 mm are arranged on the wiring board, the terminal spacing likewise contains a fabrication error of up to 0.02 mm and therefore the terminal spacing must be designed to absorb the fabrication error.

As described above, the fabrication error caused by contraction during baking, in a large-size board (e.g., a board having a length of 100 mm), the board wiring lattice must be large (e.g., approximately a 0.4 mm pitch), although the basic wiring lattice is small (e.g., approximately a 0.1 mm pitch). Consequently, in the conventional wiring board, high density wiring patterns (e.g., less than about 0.4 mm) or pads (e.g., more than 200) cannot be obtained.

SUMMARY OF THE INVENTION

In view of the foregoing problem of the conventional wiring board, an object of the present invention is to provide a wiring board and method for forming high-density pads and wiring patterns taking into consideration the dispersion in the baking-time contraction coefficient of the fabrication process of a multi-layer wiring board.

Another object of the present invention is to provide a wiring board for mounting high-density and multi-terminal devices and a method for producing the wiring board.

Still another object of the present invention is to provide a wiring board for reducing the size of the pads and wiring patterns.

In a wiring board according to a first aspect of the present invention, a first area mounts a first device which has an alignment pattern in the center of the first area. A second area, devoid of the alignment pattern, mounts a second device.

With the unique and unobvious structure of the present invention, high-density pads are formed and the wiring board reliably mounts high-density and multi-terminal devices.

BRIEF DESCRIPTION OF THE DRAWINGS

The above-mentioned and other objects, features and advantages of this invention will become more apparent by reference to the following detailed description of the invention taken in conjunction with the accompanying drawings in which.

DETAILED DESCRIPTION OF THE PREFERRED EMBODIMENTS

A wiring board in accordance with preferred embodiments of the present invention will be described in detail with reference to the accompanying drawings.

Figure 1:
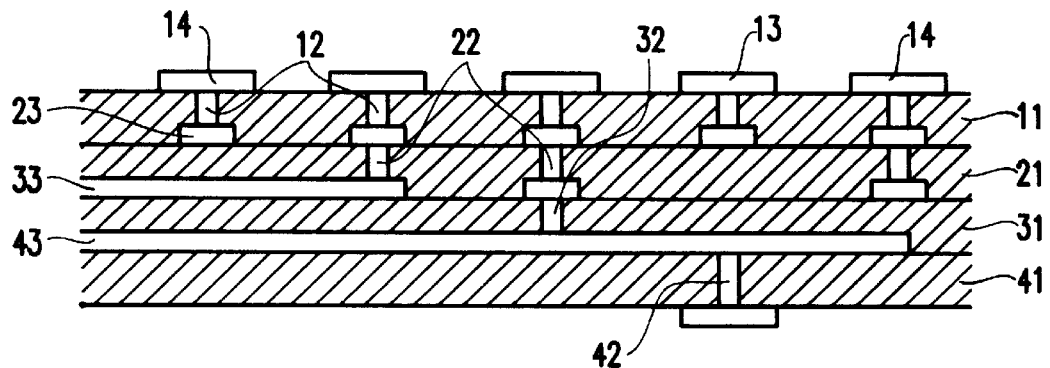
FIG. 1 is a sectional view of a wiring board according to a first embodiment of the present invention.

Referring to FIG. 1, a wiring board has an inter-insulation layer 11 having a device mounting surface, an inter-insulation layer 21 having a wiring area and forming signal wiring, an inter-insulation layer 31 having a wiring area and forming signal wiring, and an inter-insulation layer 41 having a wiring area and forming ground wiring.

Wiring patterns 13, 23, 33, and 43 are formed on the inter-insulation layers 11, 21, 31, and 41, respectively.

The inter-insulation layers 11, 21, 31, and 41 and the wiring patterns 13, 23, 33, and 43 are alternately stacked, and are baked at the same time. For example, a green sheet is used as the inter-layer insulation material and a conductive paste (e.g., a silver paste) is used as the wiring material.

In this embodiment, it is assumed that contraction of the wiring board is about 17% after baking with respect to the size before baking (e.g., the size of the wiring area, which was approximately 120 mm before baking, is reduced to approximately 100 mm). Similarly, wiring patterns 13, 23, 33, and 43 are also reduced by about 17%.

Via-holes 12, 22, 32, and 42 are provided for connecting the wiring layers formed on the different inter-insulation layers. The spacing between these via-holes is also reduced by about 17% after baking compared with the spacing therebetween before baking.

Pads 14 are provided for mounting devices on the inter-insulation layer 11.

In this embodiment, the contraction coefficient after baking is about 17% as described above. However, the contraction of ceramic material after baking is generally difficult to strictly control. In general, a dispersion (e.g., difference) in contraction between two arbitrary points of a wiring board depends on manufacturing lots (e.g., generally having an error rate of between 0.2% to 0.5%). Therefore, even if the contraction coefficient is carefully controlled, a difference usually occurs with respect to the expected sizes.

Figure 2:
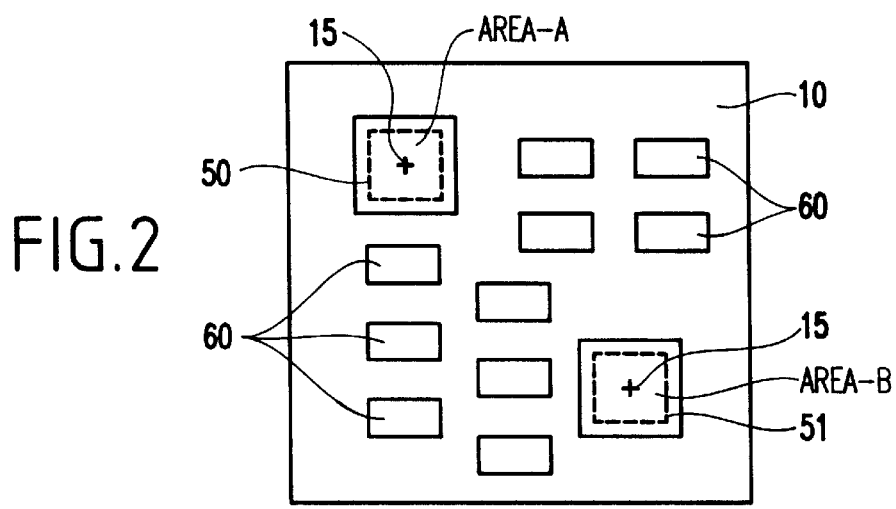
FIG. 2 is a plan view of the wiring board according to the first embodiment of the present invention.

Referring to FIG. 2, the thick-film board 10 has an area-A and an area-B. Each of the area-A and area-B comprises a square (e.g., each side having about a 24 mm length before baking, and about a 20 mm length after baking), and has printed patterns (e.g., a 96 $\mu$m width at positions according to a basic wiring lattice having a spacing of 240 $\mu$m before baking).

In an area 60 outside the area-A and area-B, printed patterns are coarser (e.g., have a wider spacing) than those of area-A and the area-B. For example, the printed patterns have about a 96 $\mu$m width at points according to a basic wiring lattice having a spacing of 480 $\mu$m before baking.

The via-holes are formed at lattice points according to the basic wiring lattice. Each via-hole is filled with a conductive paste (e.g., a silver paste).

Substantially in the center of the area-A and area-B, alignment patterns 15 are formed for aligning the device during mounting.

The pads 14 are arranged at a predetermined interval and width. In the area-A and area-B, the interval of the pads is assumed to be about 240 $\mu$m before baking and about 200 $\mu$m after baking, and the width is assumed to be about 120 $\mu$m before baking and about 100 $\mu$m after baking. On the other hand, in the other area outside of the area-A and area-B, the interval of the pads is assumed to be about 480 $\mu$m before baking and about 400 $\mu$m after baking, and the width is assumed to be about 240 $\mu$m before baking and about 200 $\mu$m after baking.

The devices 50 and 51 mounted on the areas A and B have a large number of terminals (e.g., at least 240 terminals). Terminals of the devices are aligned with the pads 14 by the alignment pattern 15 and then the terminals are soldered.

In this example, assuming a length of 20 mm, since the alignment pattern 15 is substantially in the center of the area-A and area-B, the maximum distance between each terminal and the alignment pattern 15 will be:

$$10.0 \text{ mm} \times 2^{1/2} = 14.1 \text{ mm}.$$

Assuming the deflection (e.g., deviation) of the contraction coefficient to be about 0.2%, the maximum distance error will be:

$$14.1 \text{ mm} \times 0.2\% = 28.2 \ \mu\text{m}.$$

Therefore, since the error is sufficiently small as compared with the interval of the pads (e.g., about 200 $\mu$m), a mounting operation can be reliably performed.

Figure 3:
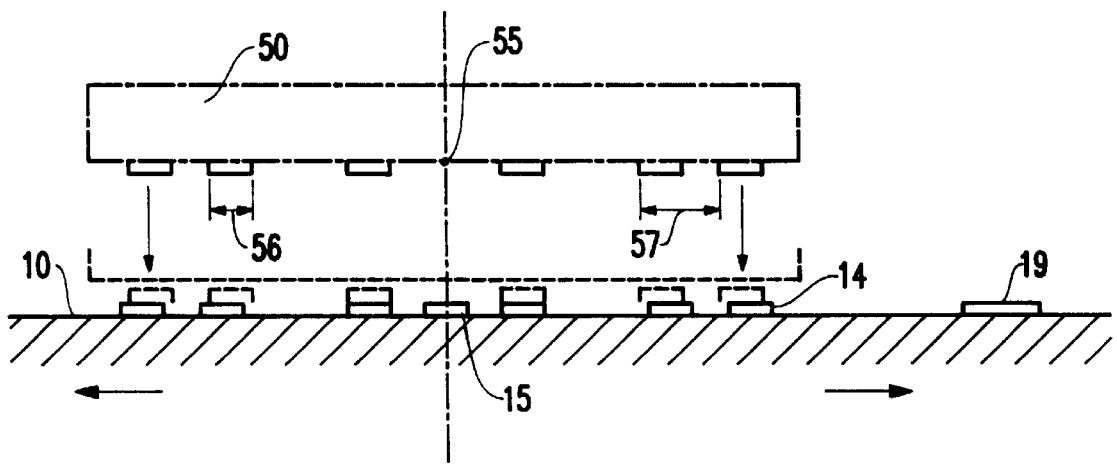
FIG. 3 is a side view of the wiring board according to the first embodiment of the present invention.

Next, referring to FIG. 3, contraction of a ceramic thick-film layer in a fabrication process is described.

Referring to FIG. 3, the device 50 is mounted on the area-A. A pitch 57 of the terminals is assumed to be about 200 $\mu$m, and a number of terminals is assumed to be about 60 on one side, although some of the terminals are omitted in FIG. 3.

The device 50 maintains its size during the fabrication process. On the other hand, a size 56 and a position of the pads on the ceramic multi-layer wiring board changes according to the contraction of the ceramic thick-film layer during the fabrication process.

The device 50 has an alignment mark 55. During a mounting operation of the device 50, the alignment mark 55 is aligned with the alignment pattern 15 on the wiring board 10.

With the alignment operation described above, assuming the number of terminals to be 60, the pitch 57 of the terminals to be about 200 $\mu$m, and the deflection of the contraction coefficient to be about 0.2%, the maximum positional dislocation between the terminal of the device and the pad on the wiring board will be:

$$(60-1)/2 \times 200 \ \mu\text{m} \times 2^{1/2} 0.2\% = 16.6 \ \mu\text{m}.$$

Next, a variation of the first embodiment of the present invention will be described in detail with reference to FIG. 4.

Figure 4:
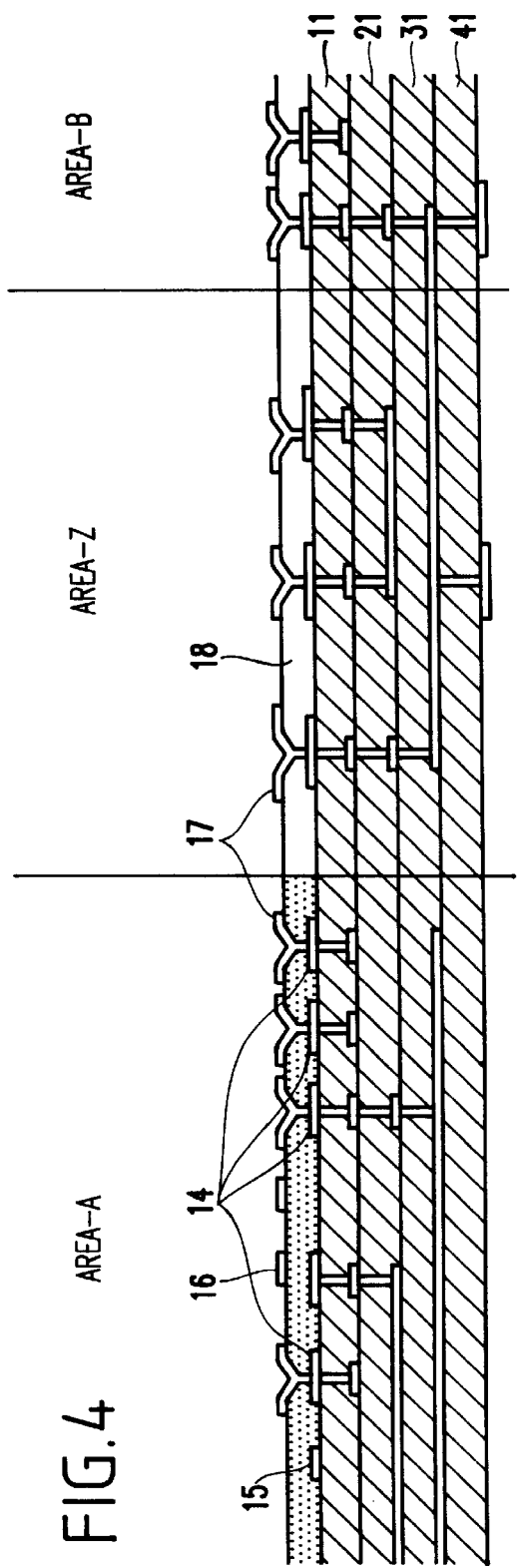
FIG. 4 is a sectional view of the wiring board according to a variation of the first embodiment of the present invention.

Referring to FIG. 4, a variation of the first embodiment of the present invention includes polyimide wiring layers 18 each having thin-film patterns 16 and pads 17 being added to the area-A and area-B of the first embodiment shown in FIG. 2.

Each of the pads 14 in the first embodiment forms a connection terminal that is connected to the lowermost layer of the polyimide thin-film wiring layer. The wiring of the ceramic multi-layer wiring board and the wiring of the thin-film wiring layer are connected by the connection between the connection terminal 14 of the ceramic multi-layer wiring board and the pad 17 of the thin-film wiring layer. The area shown as area-Z in FIG. 4 represents a portion other than the area-A and area-B.

Next, an exposure method, which is used when forming the thin-film wiring layer of the variation of the first embodiment of the present invention shown in FIG. 4, will be described with reference to FIG. 5.

Figure 5:
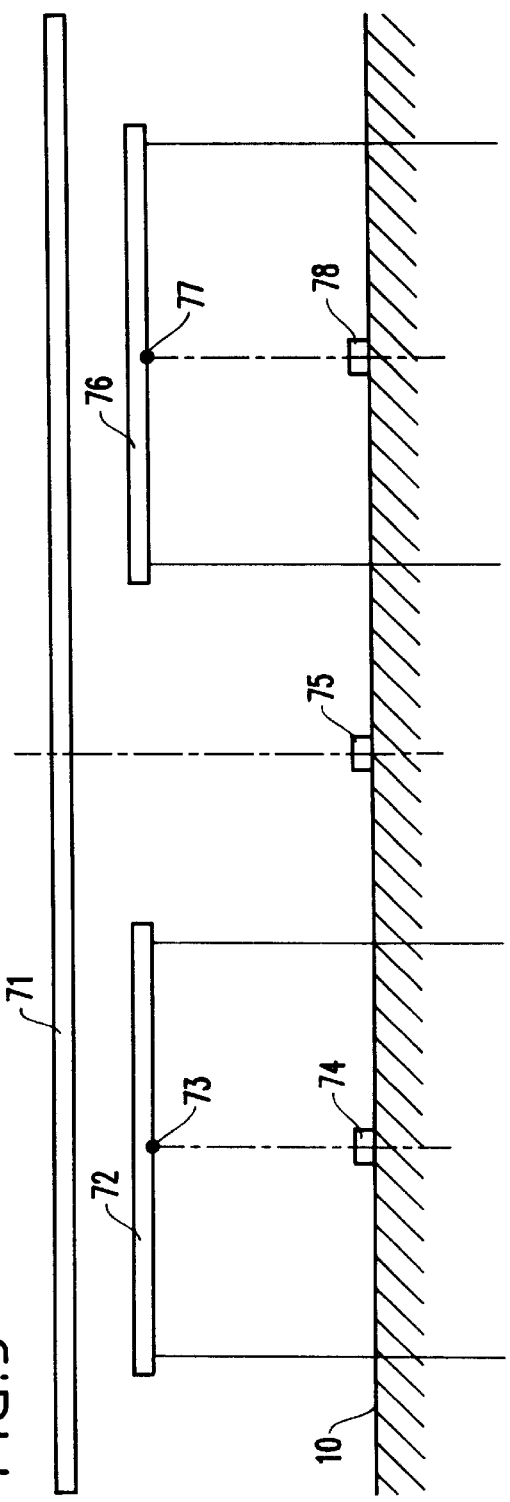
FIG. 5 is a side view of the wiring board according to the variation of the first embodiment of the present invention.

Referring to FIG. 5, the area-A and area-B are exposed using the alignment patterns 74 and 78 located in the centers of the area-A and area-B. An exposure mask 72 for the area-A and an exposure mask 76 for the area-B have alignment marks 73 and 77, respectively. Therefore, even if a position of the pad on the ceramic multi-layer wiring board is dislocated due to contraction deflection by baking, dislocation between the connection terminal 14 on the ceramic multi-layer wiring board and the pad on the thin-film wiring layer is decreased.

An exposure mask 71 for the area-Z covers substantially the entire area of the wiring board 10, and alignment with the ceramic multi-layer wiring board is performed at one location 75. Thus, in the area-Z, the dislocation between the connection terminal 14 on the ceramic multi-layer wiring board and the pad 17 on the thin-film wiring layer is larger than that of the area-A and area-B.

Figure 6:
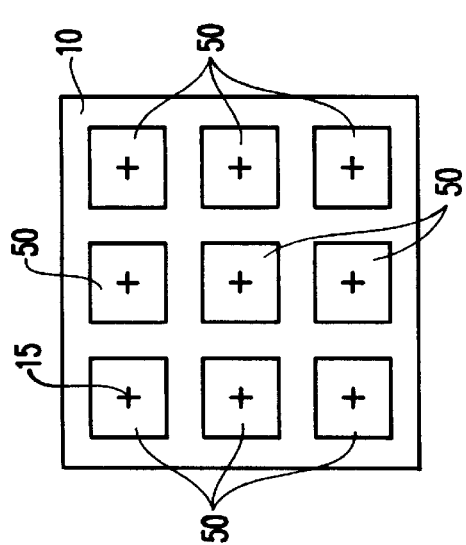
FIG. 6 is a plan view of the wiring board according to the variation of the first embodiment of the present invention.

In the first embodiment of the present invention and the variation of the first embodiment, the devices 50 and 51 with a large number of terminals have been disposed in the area-A and area-B. When a large number (e.g., 9) of such devices with a large number of terminals are arrayed, the devices are arrayed in a lattice and, at the same time, the areas where the basic wiring lattice is fine (e.g., an approximately 0.1 mm spacing) are arranged in correspondence with the devices arrayed in the lattice, as shown in FIG. 6.

Next, a second embodiment of the present invention will be described in detail with reference to FIG. 7.

Figure 7:
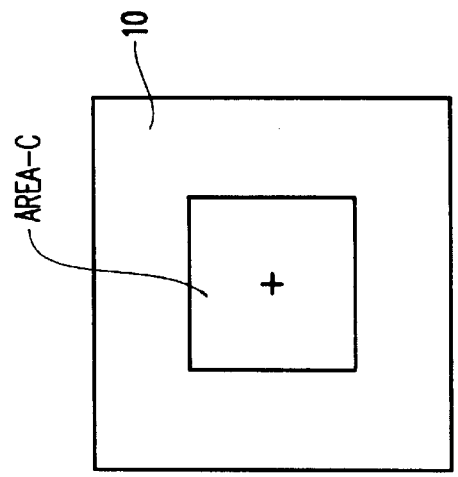
FIG. 7 is a plan view of the wiring board showing concentric areas according to a second embodiment of the present invention.

Referring to FIG. 7, a feature of the second embodiment of the present invention includes portions requiring relatively fine wiring being positioned at a single place (e.g., "area-C") substantially in the vicinity of the center of the wiring board. In this example, an alignment pattern is disposed at the center of the limited area-C and alignment is performed thereat. By such positioning of the devices requiring fine wiring, a fine wiring connection, which is not affected easily by the contraction deviation, becomes possible substantially in the vicinity of the center of the area-C.

The sectional structure of the thick-film wiring board in this second embodiment is identical to that of the variation of the first embodiment of the present invention shown in FIG. 4. In addition, as with the first embodiment, the contraction coefficient is not strictly controllable.

In this thick-film board, the area-C comprises a square (e.g., having a substantially 60 mm length side before baking, and about a 50 mm length side after baking), and has printed patterns (e.g., a substantially 96 $\mu$m width at positions according to a basic wiring lattice having a spacing of about 360 $\mu$m before baking).

In an area outside the area-C, printed patterns are coarser than in the area-C (e.g., a 96 $\mu$m width at points according to a basic wiring lattice having a spacing of 480 $\mu$m before baking).

In the second embodiment of the present invention, a thin-film wiring layer (unreferenced in FIG. 7) is formed on the upper layer of the thick-film wiring board 10.

In the thin-film wiring layer, printed patterns are defined according to a basic wiring lattice (e.g., a substantially 40 Am width, and about a 100 $\mu$m pitch, while the pitch of the connection terminals to the thick-film wiring board 10 is about 300 $\mu$m in the area-C and about 400 $\mu$m in areas other than the area-C).

Assuming the length of one side of the area-C to be 60 mm and the deviation of the contraction coefficient to be 0.2%, the maximum dislocation of the distance from the center of the board in the area-C will be about:

$$30 \text{ mm} \times^{1/2} \times 0.2\% = 84.8 \text{ }\mu\text{m}.$$

On the other hand, in the thin-film wiring layer 18, a wiring pattern 16 is formed as designed, because the deviation of the contraction coefficient does not occur. Therefore, in the area-C the maximum dislocation (e.g., about 84.4 $\mu$m) occurs between pads 14 on the thick-film wiring board and pads 17 on the thin-film wiring layer, but the positional dislocation is small compared to the pitch of the connection terminals (e.g., about 300 $\mu$m). If the connection terminal is formed in a circular cone having a diameter of about 150 $\mu$m, for example, the positional dislocation can be absorbed.

Assuming the length of one side of the wiring board to be about 120 mm, in the outside of the area-C, a distance from the center of the board has a maximum dislocation of:

$$60 \text{ mm} \times 2^{1/2} \cdot 0.2\% = 169.7 \text{ }\mu\text{m}.$$

This dislocation can be absorbed, for example, by setting the pitch of the connection terminal to about 400 $\mu$m and forming the connection terminal to have a circular diameter of 250 $\mu$m.

In the formation of the wiring board of the second embodiment, an exposure mask is sized so that it can cover substantially the entire board, patterns of not only the area-C but also the area outside the area-C are drawn on the exposure mask, and substantially the entire area is exposed by using the alignment pattern located in the central portion of the area-C. With this method, the patterns of the entire area can be formed with a single exposure process simultaneously with the area-C. In this case, the alignment accuracy between the connection terminal of the ceramic multi-layer wiring board and the via-hole of the thin-film wiring layer decreases in the area outside the area-C than in the area-C.

Next, a third embodiment of the present invention will be described in detail in reference to FIG. 8.

A feature of the third embodiment of the present invention resides in the spacing of the wiring lattice in the central portion of the wiring board is narrowest and is gradually widened toward the peripheral portion.

Figure 8:
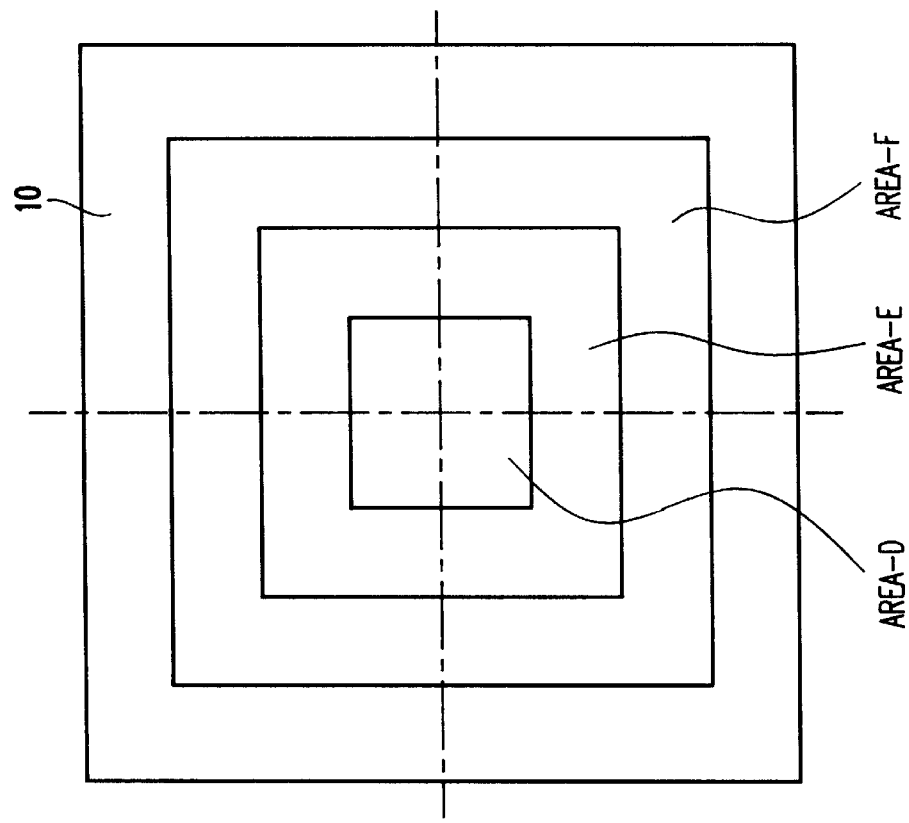
FIG. 8 is a plan view of the wiring board showing concentric areas according to a third embodiment of the present invention.

Referring to FIG. 8, the thick-film wiring board 10 has an area-D, an area-E, and an area-F. Each of the areas comprises a square (e.g., having a substantially 60 mm length side for the area-D, a 120 mm length side for the area-E, and a 180 mm length side for the area-F, before baking). The area-E is disposed outside the area-D, and the area-F is disposed outside the area-E.

The area-D has printed patterns according to a basic wiring lattice having a predetermined spacing (e.g., about 360 $\mu$m before baking, and about 300 $\mu$m after baking).

The area-E has printed patterns according to a basic wiring lattice having a predetermined spacing (e.g., about 480 $\mu$m before baking, and about 400 $\mu$m after baking).

The area-F has printed patterns according to a basic wiring lattice having a predetermined spacing (e.g., about 600 $\mu$m before baking, and about 500 $\mu$m after baking).

Thus, the spacing of the wiring lattice in the central portion (e.g., area-D) of the wiring board is narrowest and gradually increases outwardly toward the periphery (e.g., from area-E and area-F). The advantage of such a structure is that devices having highest-density pads are mounted in the central portion and other devices are mounted toward periphery depending on the density of the pads.

As is apparent from the above description, according to the present invention, since the wiring board has the alignment pattern, pads can be formed with high density, and the wiring board can mount high-density and multi-terminal devices, while considering the contraction dispersion of a ceramic multi-layer wiring board.

If the thick-film wiring board of the present invention is used as a base board for a thin-film wiring, a thick-film and thin-film mixed wiring board can be obtained with density higher than that of a conventional mixed wiring board.

In addition, the thick-film wiring board of the present invention can mount a multi-terminal device having higher density than the conventional device.

While the invention has been described in terms of several preferred embodiments, those skilled in the art will recognize that the invention can be practiced with modification within the spirit and scope of the appended claims.

What is claimed is:

1. A wiring board, comprising:
   a first area for mounting a first device, said first area having an alignment pattern substantially in a center of said first area for aligning said first device, said first area having a first wiring lattice having a first pattern spacing for mounting said first device; and
   a second area, co-planar with and substantially concentric with said first area, having a second wiring lattice having a second pattern spacing for mounting a second device, said second pattern spacing being fixedly wider than said first pattern spacing and getting coarser with an increase of distance from said alignment pattern.

2. The wiring board according to claim 1, wherein said first area comprises an area substantially in a center of the wiring board.

3. The wiring board of claim 1 wherein said second area is substantially concentric with said first area on said wiring board and extends from a periphery of said first area, whereby said first alignment pattern is substantially centrally located relative to said second area, and said first alignment pattern provides alignment for both said first and said second area.

4. The wiring board of claim 1 comprising a third area, co-planar with and substantially concentric with said first area and said second area, having a third wiring lattice having a third pattern spacing for mounting a third device, said third pattern spacing being wider than said second pattern spacing, wherein said third area extends from a periphery of said second area, whereby said first alignment pattern is substantially centrally located relative to said third area, and said first alignment pattern provides alignment for said third area.

5. A wiring board, comprising:
   at least one inter-insulation layer;
   a wiring pattern on said at least one inter-insulation layer; and
   a pad connected to said wiring pattern, on an uppermost layer of said at least one inter-insulation layer, wherein said wiring board includes:
   a first area, including a first wiring lattice, having a first pattern spacing, for mounting a first device, said first area having an alignment pattern substantially in a center of said first area for aligning said first device; and
   a second area, co-planar with and substantially concentric with said first area, including a second wiring lattice having a second pattern spacing for mounting a second device, said second pattern spacing being fixedly wider than said first pattern spacing and getting coarser with an increase of distance from said alignment pattern.

6. The wiring board according to claim 5, further comprising:
   a via-hole for connecting adjacent layers of said at least one inter-insulation layer.

7. The wiring board according to claim 5, wherein said at least one inter-insulation layer comprises a ceramic sheet.

8. The wiring board according to claim 5, wherein said wiring pattern comprises a conductive paste.

9. The wiring board according to claim 5, further comprising:
   a thin-film wiring layer on an uppermost layer of said at least one inter-insulation layer.

10. The wiring board according to claim 9, wherein said thin-film wiring layer comprises a polyimide sheet.

11. The wiring board according to claim 5, further comprising a second alignment pattern substantially in a center of said second area.

12. The wiring board according to claim 5, further comprising a third area, arranged in a lattice, for mounting a third device.

13. The wiring board according to claim 5, wherein said first area comprises an area in a center of the wiring board.

14. The wiring board according to claim 5, further comprising a third area having a third pattern spacing which is wider than said second pattern spacing, arranged adjacent said second area.

15. A wiring board produced by a process comprising:
   preparing an inter-insulation layer;
   stacking a wiring pattern on said inter-insulation layer;
   forming an alignment pattern substantially in a center of a first area on said inter-insulation layer; and
   baking said inter-insulation layer;
   said first area including a first wiring lattice having a first pattern spacing for mounting a first device, said alignment pattern for aligning said first device,
   said wiring board further including a second area, co-planar with and substantially concentric with said first area, having a second wiring lattice having a second pattern spacing for mounting a second device, said second pattern spacing being fixedly wider than said first pattern spacing and getting coarser with an increase of distance from said alignment pattern.

16. The wiring board according to claim 15, said process further comprising:
   aligning an exposure mask with said alignment pattern in said first area; and
   exposing said first area.

17. The wiring board according to claim 15, said process further comprising:
   aligning an exposure mask with said alignment pattern in said first area; and
   exposing said inter-insulation layer.

* * * * *